(12) United States Patent
Low et al.

(10) Patent No.: US 10,281,564 B2
(45) Date of Patent: May 7, 2019

(54) REFRACTIVE BEAM STEERING DEVICE USEFUL FOR AUTOMATED VEHICLE LIDAR

(71) Applicant: Aptiv Technologies Limited, St. Michael (BB)

(72) Inventors: Yew Kwang Low, Singapore (SG); Kok Wee Yeo, Singapore (SG); Chee Keng Yeo, Singapore (SG)

(73) Assignee: Aptiv Technologies Limited (BB)

( * ) Notice: Subject to any disclaimer, the term of this patent is extended or adjusted under 35 U.S.C. 154(b) by 314 days.

(21) Appl. No.: 15/196,347

(22) Filed: Jun. 29, 2016

(65) Prior Publication Data

US 2018/0003804 A1   Jan. 4, 2018

(51) Int. Cl.

| | |
|---|---|
| *G01C 3/08* | (2006.01) |
| *G01S 7/481* | (2006.01) |
| *G01S 17/08* | (2006.01) |
| *G01S 17/93* | (2006.01) |
| *G02B 26/08* | (2006.01) |
| *G02B 26/10* | (2006.01) |
| *H01S 5/00* | (2006.01) |
| *H01S 5/40* | (2006.01) |

(52) U.S. Cl.
CPC ........... *G01S 7/4817* (2013.01); *G01S 17/08* (2013.01); *G01S 17/936* (2013.01); *G02B 26/0875* (2013.01); *G02B 26/103* (2013.01); *H01S 5/0071* (2013.01); *H01S 5/4025* (2013.01)

(58) Field of Classification Search
CPC ...... G01S 7/4817; G01S 17/08; G01S 17/936; G02B 26/0875; G02B 26/103; H01S 5/4025; H01S 5/0071
USPC ....................................................... 356/4.01
See application file for complete search history.

(56) References Cited

U.S. PATENT DOCUMENTS

| | | | |
|---|---|---|---|
| 5,093,757 A | 5/1992 | Dorschner | |
| 8,692,983 B1* | 4/2014 | Chapman | .................. G01P 5/26 342/124 |
| 9,435,638 B2* | 9/2016 | Chayat | ..................... G01S 17/89 |
| 2004/0240766 A1 | 12/2004 | Anderson et al. | |
| 2005/0129072 A1 | 6/2005 | Tayebati et al. | |
| 2007/0263963 A1 | 11/2007 | Hughes et al. | |
| 2012/0206791 A1 | 8/2012 | Pijlman et al. | |
| 2014/0042133 A1 | 2/2014 | Weick | |
| 2014/0198367 A1 | 7/2014 | Tan et al. | |
| 2015/0268481 A1* | 9/2015 | Strohmeier | .......... H04N 5/2254 348/294 |
| 2016/0363737 A9* | 12/2016 | Aschwanden | ........... G02B 3/14 |

FOREIGN PATENT DOCUMENTS

| | | |
|---|---|---|
| WO | 03/104856 A1 | 12/2003 |
| WO | 2015/004213 A1 | 1/2015 |

* cited by examiner

*Primary Examiner* — Mark Hellner
(74) *Attorney, Agent, or Firm* — Lawrence D. Hazelton

(57) ABSTRACT

An illustrative example device for steering a beam of radiation includes at least one compressible optic component including at least one lens in a compressible optic material adjacent the lens. An actuator controls an orientation of the lens by selectively applying pressure on the compressible optic material.

18 Claims, 2 Drawing Sheets

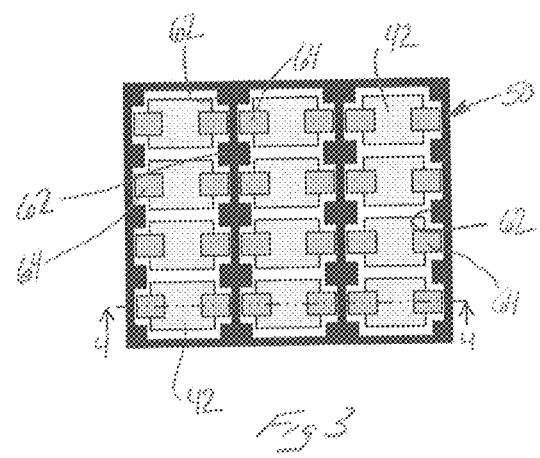
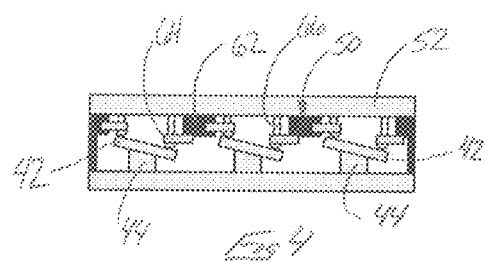
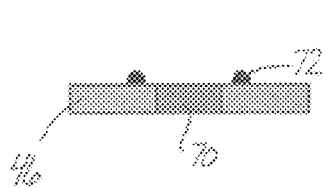 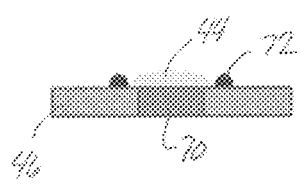 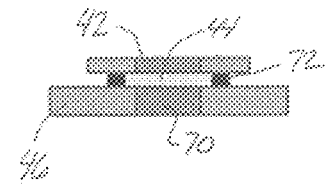
FIG. 5A  FIG. 5B  FIG. 5C

REFRACTIVE BEAM STEERING DEVICE USEFUL FOR AUTOMATED VEHICLE LIDAR

BACKGROUND

Advances in electronics and technology have made it possible to incorporate a variety of advanced features on automotive vehicles. Various sensing technologies have been developed for detecting objects in a vicinity or pathway of a vehicle. Such systems are useful for parking assist and cruise control adjustment features, for example.

More recently, automated vehicle features have become possible to allow for autonomous or semi-autonomous vehicle control. For example, cruise control systems may incorporate LIDAR (light detection and ranging) for detecting an object or another vehicle in the pathway of the vehicle. Depending on the approach speed, the cruise control setting may be automatically adjusted to reduce the speed of the vehicle based on detecting another vehicle in the pathway of the vehicle.

There are different types of LIDAR systems. Flash LIDAR relies upon a single laser source to illuminate an area of interest. Reflected light from an object is detected by an avalanche photodiode array. While such systems provide useful information, the avalanche photodiode array introduces additional cost because it is a relatively expensive component. Additionally, the laser source for such systems has to be relatively high power to achieve sufficiently uniform illumination of the area of interest. Scanning LIDAR systems utilize different components compared to flash LIDAR. One challenge associated with previously proposed scanning LIDAR systems is that additional space is required for the scanning components and there is limited packaging space available on vehicles. Optical phase arrays LIDAR systems utilize beam multiplexing that tends to introduce relatively significant power loss.

There is a need for improvements in components for systems, such as LIDAR systems, that are lower-cost, easier to fit within small packaging constraints, and utilize power efficiently.

SUMMARY

An illustrative example device for steering a beam of radiation includes at least one compressible optic component including at least one lens and a compressible optic material adjacent the lens. An actuator controls an orientation of the lens by selectively applying pressure on the compressible optic material.

In an example embodiment having one or more features of the device of the previous paragraph, there are a plurality of compressible optic components each including at least one lens and compressible optic material. The actuator selectively controls an orientation of the lenses, respectively.

In an example embodiment having one or more features of the device of either of the previous paragraphs, the actuator controls the orientation of the lenses such that all of the lenses have the same orientation.

In an example embodiment having one or more features of the device of any of the previous paragraphs, the actuator includes a plurality of moveable components, each of the plurality of compressible optic components is associated with at least one of the moveable components, and a position or orientation of the moveable components controls the pressure is on the compressible optic material of the respective compressible optic components.

In an example embodiment having one or more features of the device of any of the previous paragraphs, the actuator comprises a micro-electro-mechanical (MEMs) actuator.

In an example embodiment having one or more features of the device of any of the previous paragraphs, the moveable components respectively comprise moveable electrodes, the actuator comprises at least one stationary electrode, and the moveable electrodes are moveable relative to the stationary electrode in at least a first direction and a second direction that is transverse to the first direction.

An example embodiment having one or more features of the device of any of the previous paragraphs includes a source of radiation situated to emit radiation through the at least one compressible optic component.

In an example embodiment having one or more features of the device of any of the previous paragraphs, the source of radiation comprises at least one laser diode.

In an example embodiment having one or more features of the device of any of the previous paragraphs, an output from the at least one compressible optic component is a LIDAR beam.

In an example embodiment having one or more features of the device of any of the previous paragraphs, the compressible optic material has an index of refraction, an angle of a beam of radiation from the at least one compressible optic component has a relationship with an angle of orientation of the at least one lens, and the relationship is based on the index of refraction.

An illustrative example embodiment of a method of steering a beam of radiation includes directing radiation through at least one compressible optic component that includes at least one lens and a compressible optic material adjacent the lens, and controlling an orientation of the at least one lens by selectively applying pressure on the compressible optic material.

In an example embodiment having one or more features of the method of the previous paragraph, the at least one compressible optic component comprises a plurality of compressible optic components each including at least one lens and compressible optic material, and the method comprises selectively controlling an orientation of the lenses, respectively.

In an example embodiment having one or more features of the method of any of the previous paragraphs, selectively controlling the orientation of the lenses includes establishing the same orientation for all of the lenses.

An example embodiment having one or more features of the method of any of the previous paragraphs includes controlling the orientation of the lenses, respectively, using an actuator that comprises a plurality of moveable components, wherein each of the plurality of compressible optic components is associated with at least one of the moveable components; and changing a position or orientation of at least a selected one of the moveable components changes the pressure on the compressible optic material of a corresponding one of a compressible optic components.

In an example embodiment having one or more features of the method of any of the previous paragraphs, the actuator comprises a micro-electro-mechanical (MEMs) actuator.

In an example embodiment having one or more features of the method of any of the previous paragraphs, the moveable components respectively comprise moveable electrodes, the actuator comprises at least one stationary electrode, and the method comprises moving at least a selected one of the moveable electrodes relative to the stationary electrode in at least one of a first direction and a second direction that is transverse to the first direction.

An example embodiment having one or more features of the method of any of the previous paragraphs includes using at least one laser diode as a source of the radiation.

An example embodiment having one or more features of the method of any of the previous paragraphs includes emitting a LIDAR beam from the at least one compressible optic component.

An illustrative example embodiment of a LIDAR device for use on a vehicle includes a source of radiation, at least one compressible optic component including at least one lens and a compressible optic material adjacent the lens, and an actuator that controls an orientation of the lens relative to the source of radiation by selectively applying pressure on the compressible optic material, wherein the at least one compressible optic component directs a beam of radiation from the source of radiation in a selected direction based upon the orientation of the lens.

In an example embodiment having one or more features of the LIDAR device of the previous paragraphs, the actuator comprises a micro-electro-mechanical (MEMs) actuator.

Various features and advantages of at least one disclosed example embodiment will become apparent to those skilled in the art from the following detailed description. The drawings that accompany the detailed description can be briefly described as follow.

BRIEF DESCRIPTION OF THE DRAWINGS

FIG. 3 schematically illustrates selected portions of an actuator and compressible optical components arranged according to an embodiment of this invention.

FIG. 4 is a cross-sectional illustration taken along the lines 4-4 in FIG. 3.

FIGS. 5A-5C schematically illustrate an example technique of making a compressible optic component designed according to an embodiment of this invention.

DETAILED DESCRIPTION

Figure 1:
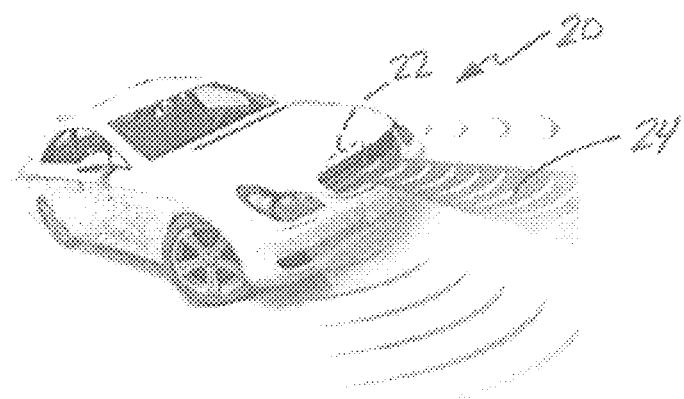
FIG. 1 schematically illustrates a vehicle including a detection device having beam steering components designed according to an embodiment of this invention.

FIG. 1 schematically illustrates a vehicle 20 including a detection device 22. For discussion purposes, the detection device 22 is a LIDAR device that emits at least one beam of radiation 24 that is useful for detecting objects in a vicinity or pathway of the vehicle 20. In this example, the beam of radiation 24 comprises light that is directed at a selected angle relative to the vehicle 20.

Figure 2:
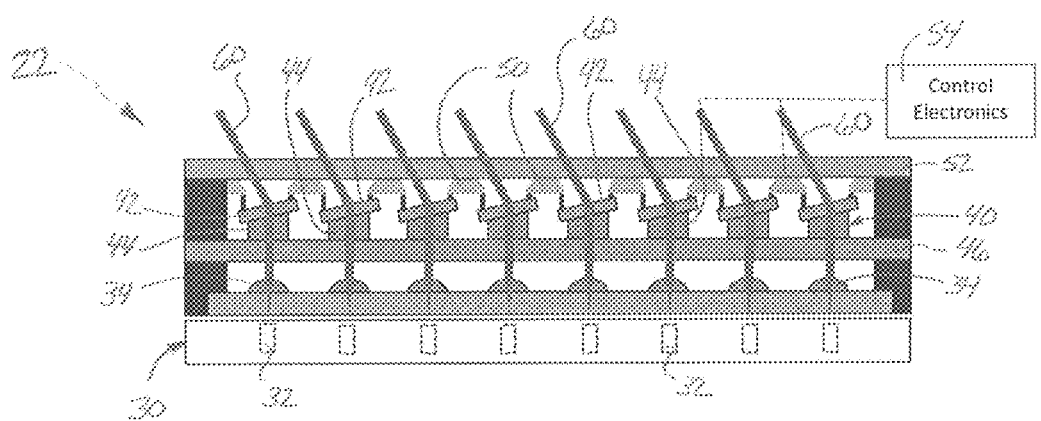
FIG. 2 schematically illustrates an example device for steering a beam of radiation designed according to an embodiment of this invention.

FIG. 2 schematically illustrates a portion of the LIDAR device 22 that is useful for steering a beam of radiation in a desired direction, manner or pattern. A source of radiation 30 in this example includes a plurality of laser diodes 32. The radiation in this example comprises light.

Given that laser diodes 32 are used in this example, beam controlling lenses 34 are included for collimating the light emitted by the laser diodes 32. The collimating lenses 34 control a beam width from each laser diode to avoid undesired divergence of those beams as would otherwise occur because of the typical emissions from a laser diode.

At least one compressible optic component 40 is situated relative to the source of radiation 30 so that emitted radiation passes through and is refracted by the compressible optic component 40. In this example, a plurality of compressible optic components 40 are arranged so that each laser diode 32 has an associated compressible optic component 40.

The compressible optic components 40 each include at least one lens 42 and compressible optic material 44. The compressible optic components 40 are supported on a layer 46, which is generally optically transparent at least at locations of the compressible optic components 40. The layer 46 in this example does not have a significant impact on the beams of light from the laser diodes 32 prior to those beams reaching the compressible optic components 40.

Example compressible optic materials include gels, such as G608N available from Thorlabs, Inc. The lenses 42 in this example comprise ultrathin glass layers. Those skilled in the art that have the benefit of this description will be able to select materials that meet the needs of their particular situation.

A plurality of actuators 50 control an orientation of each of the lenses 42. The actuators 50 are supported on a substrate 52 in this example. Control electronics 54 control the actuators 50. In some examples, the substrate 52 includes circuit traces useful for controlling the actuators 50.

The actuators 50 control the orientation of the lenses 42 by selectively applying pressure on the compressible optic components 40 causing selective compression of the compressible optic material 44. In the illustrated example, a portion of the actuators 50 contacts and selectively moves the lens 42 into a desired orientation. Moving the lens changes the pressure on the compressible optic material 44 with the pressure increasing or decreasing depending on the movement of the lens 42 from one orientation or position to another.

The actuators 50 in some embodiments selectively apply pressure on the compressible optic components 40 in selected directions or locations to achieve a desired lens orientation. Some embodiments include changing an amount of pressure on the compressible optic material 44 to achieve a desired change in orientation of the corresponding lens 42. Other embodiments utilize a combination of selected pressures and selected locations where pressure is applied to the compressible optic components 40. The compressibility of the compressible optic material 44 allows the lenses 42 to move into different orientations to achieve different directions of the output beam 60.

Output beams 60 follow a trajectory that is determined by a current condition of the compressible optic components 40. An angle of orientation of the lenses 42 and the refractive index of the compressible optic material 44 controls the direction of the output beams 60. The actuators 50 may cause the lenses 42 to move in a pattern that yields a desired beam scanning pattern.

The direction of the output beams 60 has a relationship with the angle of orientation of the lenses 42, respectively, and that relationship is based on the index of refraction of the compressible optic material 44. Higher indices of refraction require less angular manipulation of the lenses 42 for achieving a change in the angular direction of the output beams 60. In other words, selecting a compressible optic material with a higher index of refraction allows for requiring less manipulation of the orientation of the lenses 42 to achieve the same angular displacement of the output beam 60 compared to compressible optic components having a compressible optic material with a lower index of refraction.

FIGS. 3 and 4 illustrate an example embodiment of the actuators 50. In this example, the actuators 50 comprise micro-electro-mechanical (MEMs) devices. In this example, the actuators 50 include at least one stationary electrode 62 and at least one moveable electrode 64. In this example, each of the lenses 42 has two associated moveable electrodes 64 that selectively apply pressure to the compressible optic material 44 based on a position that the moveable electrode 64 relative to its associated stationary electrode 62. As can be appreciated from FIG. 4, the moveable electrodes 64 are supported for movement relative to the substrate 52 by spring action connectors 66. More moveable electrodes could be configured for various 2D scanning patterns.

Changes in the relative positions of the moveable electrodes 64 relative to the stationary electrodes 62 changes the orientation of the lenses 42 and alters pressure applied to the compressible optic material 44.

One feature of the illustrated example embodiment is that it allows for scanning-type LIDAR applications without requiring the expense or relative bulk of previously proposed systems. For example, a separate set of directing or deflecting mirrors is not required because of the ability to steer the beams 60 by controlling the orientation of the lenses 42. Another feature of the example embodiment is that it requires less power compared to other proposed LIDAR arrangements. If, for example, a MEMs mirror array were used, approximately 500 milliwatts of power at 200 volts would be required for five micrometers of actuation. By comparison, an embodiment like the illustrated example of FIG. 2 requires only 0.95 milliwatts and up to two milliwatts at 200 volts to achieve five micrometers of actuation.

Another feature of the illustrated example embodiment is that it allows for a wider range of beam control within a smaller package. A typical LIDAR device utilizing a MEMs mirror array has a beam orientation range of +/−3° when using 99 mirror elements each requiring 0.125 mm×0.94 mm of packaging space. An embodiment like that shown in FIG. 2, on the other hand, only requires 0.015 mm×0.015 mm for each lens 42 and may only require 6 micrometers contact pitch. Such an arrangement allows for an output beam scanning range of +/−34°. The illustrated example arrangement, therefore, provides significantly more capability while occupying substantially less space. FIGS. 5A-5C schematically illustrate an example technique for making compressible optic components 40. The layer 46 includes optically transparent apertures 70, such as clear glass. An outer seal 72 comprising a flexible or compressible adhesive is dispensed outside the clear aperture 70 and establishes an area or receptacle within which the compressible optic material 44 will be maintained. The adhesive 72 may be situated in a variety of patterns, depending on the configuration of the compressible optic components 40. For example, the adhesive 72 may be situated in a ring or rectangular configuration on the layer 46.

As shown in FIG. 5B, a compressible optic gel is dispensed in a sufficient quantity to cover the aperture 70 and fill the receptacle or area established by the layer 46 and the adhesive 72. The lens 42 will then be positioned over the layer 46 controlled at a required height for a subsequent adhesive curing process, for example by ultraviolet light, heat or both. Outgassing micro vent vias are provided in some embodiments outside of the clear aperture 70 to ensure that the optical gel fills up the cavity or receptacle after compression by the lens 42. An optical vision alignment and assembly system could be used to control the required spacing between the lens 42 and the aperture 70 on the layer 46. After the lens 42 is secured to the adhesive 72, the compressible optic material 44 is maintained between the lens 42, the aperture 70 on the layer 46 and is surrounded by the adhesive 72.

Embodiments of this invention provide additional beam steering and scanning capability while requiring lower power and occupying less space compared to other proposed arrangements. Embodiments of this invention allow for achieving a desired level of beam control using less power and occupying less space, which makes embodiments of this invention well-suited for automated vehicle LIDAR systems.

The preceding description is exemplary rather than limiting in nature. Variations and modifications to the disclosed examples may become apparent to those skilled in the art that do not necessarily depart from the essence of this invention. The scope of legal protection given to this invention can only be determined by studying the following claims.

We claim:

1. A device for steering a beam of radiation, the device comprising:
at least one compressible optic component including at least one lens and a compressible optic material adjacent the at least one lens; and
an actuator that controls an orientation of the at least one lens by selectively applying pressure on the compressible optic material, wherein
the at least one compressible optic component comprises a plurality of compressible optic components respectively including at least one lens and compressible optic material; and
the actuator selectively controls an orientation of the lenses, respectively.

2. The device of claim 1, wherein the actuator controls the orientation of the lenses such that all of the lenses have the same orientation.

3. The device of claim 1, wherein
the actuator comprises a plurality of moveable components;
each of the plurality of compressible optic components is associated with at least one of the moveable components; and
a position or orientation of the movable components, respectively, controls pressure applied to the compressible optic material.

4. The device of claim 3, wherein the actuator comprises a micro-electro-mechanical (MEMs) actuator.

5. The device of claim 3, wherein
the moveable components respectively comprise moveable electrodes;
the actuator comprises at least one stationary electrode; and
the moveable electrodes are moveable relative to the stationary electrode in at least a first direction and a second direction that is transverse to the first direction.

6. The device of claim 1, comprising a source of radiation situated to emit radiation through the at least one compressible optic component.

7. The device of claim 6, wherein the source of radiation comprises at least one laser diode.

8. The device of claim 1, wherein an output from the at least one compressible optic component is a LIDAR beam.

9. The device of claim 1, wherein
the compressible optic material has an index of refraction;
an angle of a beam of radiation from the at least one compressible optic component has a relationship with an angle of orientation of the at least one lens; and
the relationship is based on the index of refraction.

10. A method of steering a beam of radiation, the method comprising:

directing radiation through at least one compressible optic component that includes at least one lens and a compressible optic material adjacent the at least one lens; and controlling an orientation of the at least one lens by selectively applying pressure on the compressible optic material, wherein the at least one compressible optic component comprises a plurality of compressible optic components respectively including at least one lens and compressible optic material; and the method comprises selectively controlling an orientation of the lenses, respectively.

11. The method of claim 10, wherein selectively controlling the orientation of the lenses includes establishing the same orientation for all of the lenses.

12. The method of claim 10, comprising controlling the orientation of the lenses, respectively, using an actuator that comprises a plurality of moveable components, wherein each of the plurality of compressible optic components is associated with at least one of the moveable components; and changing a position or orientation of at least a selected one of the movable components to thereby control the pressure on the compressible optic material of a corresponding one of the compressible optic components.

13. The method of claim 12, wherein the actuator comprises a micro-electro-mechanical (MEMs) actuator.

14. The method of claim 12, wherein the moveable components respectively comprise moveable electrodes;

the actuator comprises at least one stationary electrode; and the method comprises moving at least a selected one of the moveable electrodes relative to the stationary electrode in at least one of a first direction and a second direction that is transverse to the first direction.

15. The method of claim 10, comprising using at least one laser diode as a source of the radiation.

16. The method of claim 10, comprising emitting a LIDAR beam from the at least one compressible optical component.

17. A LIDAR device for use on an automated vehicle, comprising:

a source of radiation;

at least one compressible optic component situated in a pathway of radiation emitted by the source, the at least one compressible optic component including at least one lens and a compressible optic material adjacent the at least one lens; and an actuator that controls an orientation of the at least one lens relative to the source of radiation by selectively applying pressure on the compressible optic material, wherein a direction of a beam of radiation depends on the orientation of the at least one lens relative to the source.

18. The LIDAR device of claim 17, wherein the actuator comprises a micro-electro-mechanical (MEMs) actuator.

* * * * *